United States Patent
Chen (10) Patent No.: US 7,532,242 B1
(45) Date of Patent: May 12, 2009

(54) PIPELINED AMPLIFIER TIME DELAY INTEGRATION

(75) Inventor: Bryan J. Chen, Goleta, CA (US)

(73) Assignee: Raytheon Company, Waltham, MA (US)

( * ) Notice: Subject to any disclaimer, the term of this patent is extended or adjusted under 35 U.S.C. 154(b) by 845 days.

(21) Appl. No.: 10/899,540

(22) Filed: Jul. 26, 2004

(51) Int. Cl.
*H04N 5/335* (2006.01)

(52) U.S. Cl. ...................................... 348/295

(58) Field of Classification Search ................. 348/295, 348/296
See application file for complete search history.

(56) References Cited

U.S. PATENT DOCUMENTS

| | | | |
|---|---|---|---|
| 5,149,954 A * | 9/1992 | Pettijohn et al. | 250/208.1 |
| 5,563,405 A | 10/1996 | Woolaway, II et al. | 250/208.1 |
| 5,734,294 A | 3/1998 | Bezzam et al. | 327/552 |
| 5,828,408 A * | 10/1998 | Mottin et al. | 348/295 |
| 6,121,843 A | 9/2000 | Vampola et al. | 330/308 |
| 6,459,077 B1 * | 10/2002 | Hynecek | 250/208.1 |
| 6,563,539 B1 * | 5/2003 | Lefevre | 348/295 |

* cited by examiner

*Primary Examiner*—Sinh N Tran
*Assistant Examiner*—Paul Berardesca
(74) *Attorney, Agent, or Firm*—Leonard A. Alkov (57) ABSTRACT

A series of time delay integration TDI stages each integrate a photocurrent from a separate detector such as detectors in an array. In a first stage 20, a first integrator is initialized with a fixed bias 30, and integrates a signal from a first detector 22 during a first time interval. Next, a reset switch 26$n$ causes that integrated first detector signal to bias a second integrator 24$n$. During a second integration interval, the second integrator integrates a signal from a second detector 22$n$. Multiple stages may be arranged in series so that an integrated signal from a previous stage biases an integrator in the current stage. At a final stage, an $N^{th}$ integrator outputs the resulting signal $V_{final}$. Any bias used to initialize the first integrator is removed from $V_{final}$ to achieve a total integrated signal from the detectors. A bi-directional switch 38 at each stage enables a forward or backward scan of the detectors.

14 Claims, 5 Drawing Sheets

PIPELINED AMPLIFIER TIME DELAY INTEGRATION

FIELD OF THE INVENTION

The present invention relates to time delay and integration circuits, such as an on-chip time delay used in processing signals from a focal plane array or other arrayed group of sensors or detectors.

BACKGROUND

A time delay and integration (TDI) function operates on the premise that two or more radiation detector channels, which are disposed colinearly in a scan direction and which view the same part of a scene during a given scan, will exhibit relative signal levels that are correlated, although separated in time. However, the noise associated with each channel is not correlated. By temporal phasing (a time delay function) and adding the radiation detector channel signals (an integration function) the resultant output signal has been found to exhibit a signal-to-noise ratio that is superior to that of a single detector channel. This is because the signals sum, but the noise is root sum squared, resulting in a signal-to-noise ratio improvement equal to the square root of the number of detectors.

By example, it is assumed that an object, sensed at each detector as a spot with relative brightness, moves from a detector A to a detector B. The spot covers detector A at some time $T_1$ and a sample at detector A is taken at that time. At some later time, $T_1+t$, the spot covers detector B and another sample is taken at detector B. By adding the sample from detector A that was obtained at time $T_1$ to the sample from detector B that was obtained at time $T_1+t$, a higher signal-to-noise ratio estimate of the intensity of the spot is obtained.

Many conventional imaging systems implement the TDI function by causing all of the detectors to simultaneously take a sample of what the detectors are "seeing". This is often accomplished by sampling the detector circuitry through a switch that is coupled to a hold capacitor. When the switch is closed the voltage of the signal is placed on the capacitor. When the switch is opened this voltage remains on the capacitor until the switch is once more closed.

Conventional approaches for implementing the TDI function typically employ charge coupled devices (CCDs) or bucket-brigade device (BBD) circuits. As the name suggests, CCDs operate on a charge mode, and operate by propagating and summing charges. However, CCD circuits generally require non-standard and/or additional semiconductor processing than does conventional metal-oxide semiconductor (MOS) device fabrication, raising costs. Additionally, certain applications for arrayed detectors or sensors, such as LandSat and Ikonos remote satellite imaging systems, require radiation tolerant hardware. One figure of merit reflecting radiation 'hardness' of electronic devices is total ionizing dose, and CCDs typically exhibit a low tolerance for total ionizing radiation. This entails further specialized processing in fabricating systems using a CCD TDI arrangement. In addition, both CCDs and bucket brigades suffer from transfer inefficiencies when the number of detector channels in TDI, that is samples per pitch, becomes large.

Commonly assigned U.S. Pat. No. 4,970,567, entitled "Method and Apparatus for Detecting Infrared Radiation", issued Nov. 13, 1990 (W. L. Ahlgren et al.) discloses a monolithic structure for detecting radiation having a substrate having read out signal processing electronics integrated thereon. Commonly assigned U.S. Pat. No. 5,149,954 describe a MOS fabricated TDI circuit for each pair of detectors that equilibrates alternating capacitors with a common capacitor at each time frame.

What is needed in the art is a robust and inexpensive circuit and method for integrating signals from a line of sensors, especially a multi-dimensional array of sensors. In short, what is needed is a circuit and method offering the low light and resolution advantages of CCDs, without their current expense.

SUMMARY OF THE INVENTION

The present invention is in one aspect a circuit having a first and second stage. These stages are functionally separated and their components may or may not be physically separated. The first stage includes a first integrator having an input for receiving a signal from a detecting element. The detecting element is not a part of the inventive circuit, but is rather a radiation detector (IR, thermal, visible, etc.), bolometer, or a pixel of an array of radiation sensing elements with which the present invention is most advantageous. The second stage includes a reset switch and a second integrator. The reset switch has an input that is coupled to an output of the first integrator. The second integrator has a first input for receiving a signal from a separate detecting element and a second input coupled to an output of the reset switch. Thus, the reset switch selectively couples the first and second integrators. The integrators may be a resistor-capacitor in series, an op-amp, a transistor, or any other circuit component or component that stores a charge as a function of time. The reset switch biases the second integrator with the output of the first integrator, at least in a forward scan direction. Further details and appurtenant components are described below.

The present invention is in another aspect a circuit that includes a first means for integrating a signal from a first sensor over a first time interval, and a second means for integrating a signal from a second sensor over a second time interval. The circuit also includes a switch, termed a reset switch, which is disposed between the first and second means for integrating. Where the second time interval of the second means is subsequent to the first time interval of the first means, the switch operates to allow an integrated voltage from the first means to propagate to the second means between the first and second time intervals. That is to say, the reset switch couples the first and second integrators during a period of time between the first and second time intervals.

The present invention is in another aspect a circuit board in combination with a detector array. The detector array includes a plurality of infrared detecting elements disposed on a common substrate, each detector element having an electrical output. Typically, the output is represented by an indium bump. The circuitboard, which is preferably a circuit disposed on a silicon chip, includes two terminal circuit stages and a plurality of intermediate circuit stages. All of the circuit stages are disposed on a common substrate in electrical series with one another, and the intermediate circuit stages are disposed between the two terminal circuit stages, at least electrically though not necessarily physically. Each circuit stage includes an integrator or integrating means having a first input coupled to an output of one detector element and a second input coupled to a reset switch. Each reset switch is coupled to and controlled in accordance with a common timing means, so that all reset switches of the circuit stages operate in unison with one another. In each intermediate circuit stage and in at least one of the terminal circuit stages, the reset switch further has an input that is coupled to an output of an integrator of a separate circuit stage. Most preferably, this separate circuit stage is that circuit stage immediately adjacent to (in an electrical sense) the subject circuit stage with the reset switch and input described. At least the other of the terminal circuit stages includes an output from the series of circuit stages. That is, since all circuit stages are arranged in electrical parallel and flanked by the terminal circuit stages, one of the terminal circuit stages has an output from the entire series of circuit stages.

The present invention is in another aspect a method for integrating a signal from an arrayed series of n radiation detectors, n being an integer n=1, 2, . . . N, and n is equal to or greater than three. In the method, an output signal from a first n=1 detector is integrated during a first time interval to achieve a first integrated signal. Then, for each of the remaining n detectors in sequence, the method biases the next $n^{th}$ integrator with the $(n-1)^{st}$ integrated signal, and once biased, integrates an output signal of the $n^{th}$ detector with the $n^{th}$ integrator over an $n^{th}$ time interval. This continues for each of the n detectors and integrators, until the final $n^{th}$ detector, which is the $N^{th}$ detector and integrator. There, the method outputs a total propagated voltage $V_{final}$ from a final $n=N^{th}$ integrator.

These and other features, aspects, and advantages of the present invention will become apparent with reference to the following description in conjunction with the accompanying drawings. It is to be understood, however, that the drawings are designed solely for the purposes of illustration and not as a limitation to the claimed invention.

DETAILED DESCRIPTION

The present invention is particularly advantageous when deployed as an on-chip solution to arrayed devices that operate using an integrated time delay, such as remote imaging and sensing apparatus that use numerous bolometers or sensory pixels that when electronically processed together resolve a comprehensive image, be it infrared, thermal, visual, or the like. Such arrays of sensors are typically arranged in a plane, and termed a focal plane array.

A TDI circuit array is coupled during use to a radiation detector array. The TDI circuit array is typically comprised of silicon and MOS processing techniques are employed to fabricate the capacitors, FET switches, column driver transistors and other related circuitry thereon. As will be described below, a preferred embodiment for integrating storage elements of each inventive TDI stage is a discrete resistor (formed via MOS fabrication on a chip) in series with a capacitor. However, the circuit described herein is viable with all types of read-out integrated preamplifier circuits, including source-follower per detector (SFD), direct injection (DI), buffered direct injection (BDI or FEDI), transimpedance amplifier (CTIA), and resistive transimpedence amplifier (RTIA), to name the more common types of ROIC preamplifier circuits. The storage element 24 is therefore not limited to only a capacitor/resistor arrangement. In the preferred embodiment of the storage element, the resistor sets the integration rise time, and the capacitor integrates the signal input from a detector. Typical values for the resistors and capacitors are application specific and, for the capacitors, range from tenths of picofarads for low flux levels, to several picofarads. In that the resistors and capacitors are integrated together on a common substrate and in close proximity to one another a tolerance between the resistor values and between the capacitor values is typically in the range of approximately one percent. Furthermore, in that during use capacitors are fed from an effective voltage source, for equal signal inputs approximately equal values of charge are stored by each capacitor receiving the voltage input.

The detector and TDI arrays are coupled together by, for example, a plurality of indium bump interconnects as known in the art. The detector array may be a linear focal plane array (FPA) of detectors including coupling capacitors and source follower (SF) amplifiers. By example only, the radiation detectors may be responsive to infrared (IR) radiation and a rotating scanning mirror may be employed to scan the scene across the array.

As will be described, TDI stages according to the present invention are arranged in a serial fashion, sometimes known in the electrical amplifier arts as a pipelined arrangement, so that time signals may be propagated throughout the entire pipeline and a single external clock reference tends to synchronize the entire pipeline to a desired timing point. Defining each end of the TDI pipeline is a first and a second terminal TDI stage. The direction in which a time delay may propagate through the pipeline is reversible, and current may flow from the second terminal TDI stage to the first. Disposed between the first and second terminal TDI stages is one or preferably a plurality of TDI stages at one of numerous possible intermediate positions, these positions being relative in an electrical but not necessarily a physical sense. The various TDI stages will be detailed separately.

Figure 1:
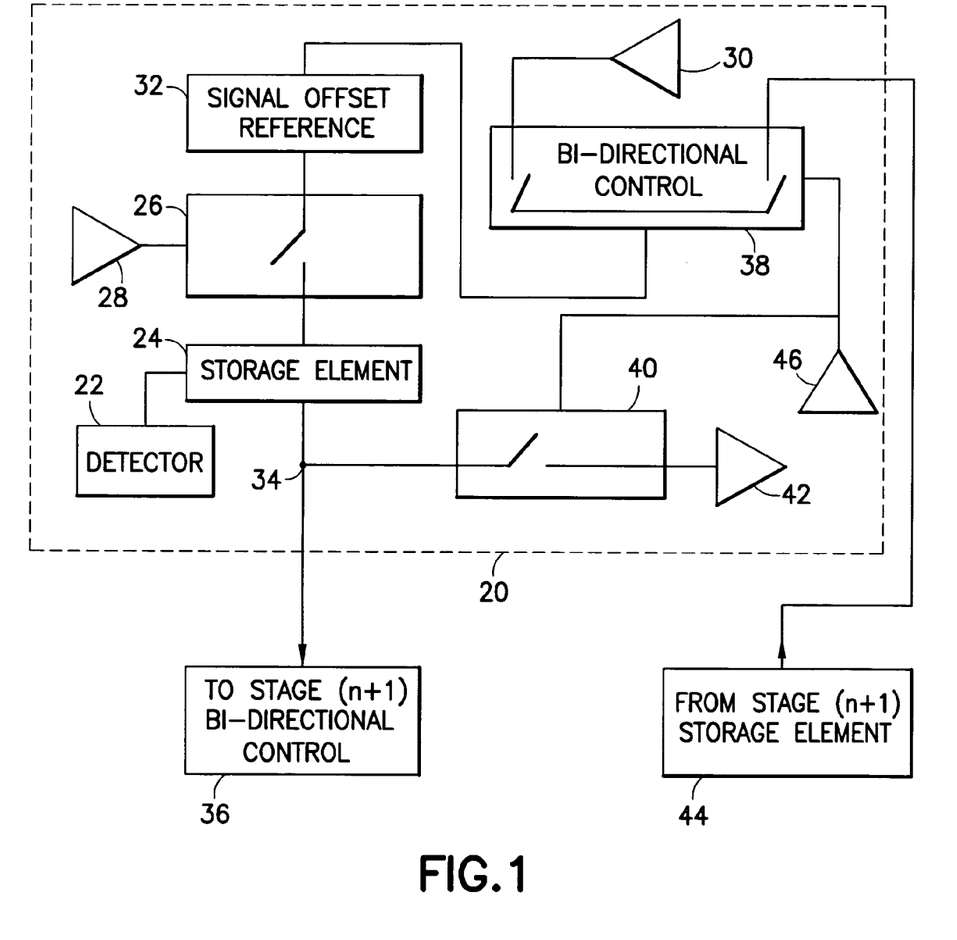
FIG. 1 is a block diagram of a time-delay integration (TDI) stage for use at a first terminal position n=1 of a pipelined time delay circuit having N stages, according to the preferred embodiment of the present invention.

FIG. 1 is a block diagram of a first terminal TDI stage 20. A photocurrent or other output from a detector 22 is integrated at a storage element 24. The storage element 24 is any component or group of components that cause a voltage or charge to be integrated and temporarily stored. The storage element 24 may be a capacitor, a resistor coupled to a capacitor, an op-amp, a transistor, or any other integrator known or yet to be developed. During each frame or integrating time interval, the storage element 24 is reset by the reset switch 26 to either a bias voltage or a signal level voltage when the reset switch is enabled. Preferably, the integrating time interval among all stages of the pipelined circuit are the same. The reset switch 26 is enabled or disabled by a switch controller 28 that flips the reset switch 26 once per frame and is preferably tied to a clock signal. For the first terminal TDI stage 20, the starvation level bias voltage 30 serves as a signal reference offset voltage 32 that is used to reset the storage element 24 through the reset switch 26. As illustrated, the signal reference offset voltage block 32 does not operate on the signal, but merely represents a node or a component to temporarily store a voltage input until the associated reset switch 26 is closed. The value of the starvation level bias voltage 22 is preferably fixed, and is based on specifications of the sensing array with which the present pipelines TDI stages operate. When the reset switch 26 is disabled, the photocurrent from a detector 22 is integrated at the storage element 24, and voltage at the storage element 24 changes with that photocurrent.

An important aspect of the present invention is how voltage is integrated among the pipelined TDI stages. The output of the storage element 24, at node 34, is input 36 into the next subsequent TDI stage as the reset voltage as will be detailed below. This voltage at node 34 may further be amplified or buffered in order to properly drive the next TDI stage.

Further in FIG. 1 are optional components that are used to enable the first terminal TDI stage 20 to also serve as the second terminal TDI state when the direction of array scan is reversed. When in the forward scan direction as described above, i.e., when the first terminal TDI stage 20 is first in the pipeline, a bi-directional control block 38 renders the starvation level bias voltage 30 as a signal offset voltage 32 by coupling the former to the reset switch 26. The signal offset reference voltage 32 may alternatively represent an offset control such as a level shifting. Also when in the forward scan direction, an output enable switch 40 decouples the output 34 of the storage element 24 from signal processing 42 such as at an integrated circuit or like analytical circuitry.

When scanning in the reverse direction and the described first terminal TDI stage 20 is at an end rather than a beginning of the pipelined stages, those switches 38, 40 are flipped. Specifically, the bi-directional control switch 38 couples an output 44 from a storage element of the previous pipelined TDI stage [termed pixel (n+1) output in FIG. 1 to represent the forward direction of pixels] to the reset switch 26 and de-couples the starvation level bias voltage 30. Concurrently, the output enable switch 40 couples the output of the storage element 24 to signal processing 42. Each of the bi-directional control switch 38 and the output enable switch 40 are preferably controlled by a directional control 46 that controls each of these switches in every TDI stage in the pipeline (though only terminal stages include the output enable switch). As will be evident, the last terminal TDI stage, in either direction, outputs a cumulative integration of photocurrent for the entire N stage TDI channel. For purposes herein, the variable N as a capital refers to the one TDI stage that is at the last of pipelined TDI stages considering the scan direction, and the variable n in lowercase refers to only a specific stage when a value is assigned such as n=1, n=2, etc.

Figure 2:
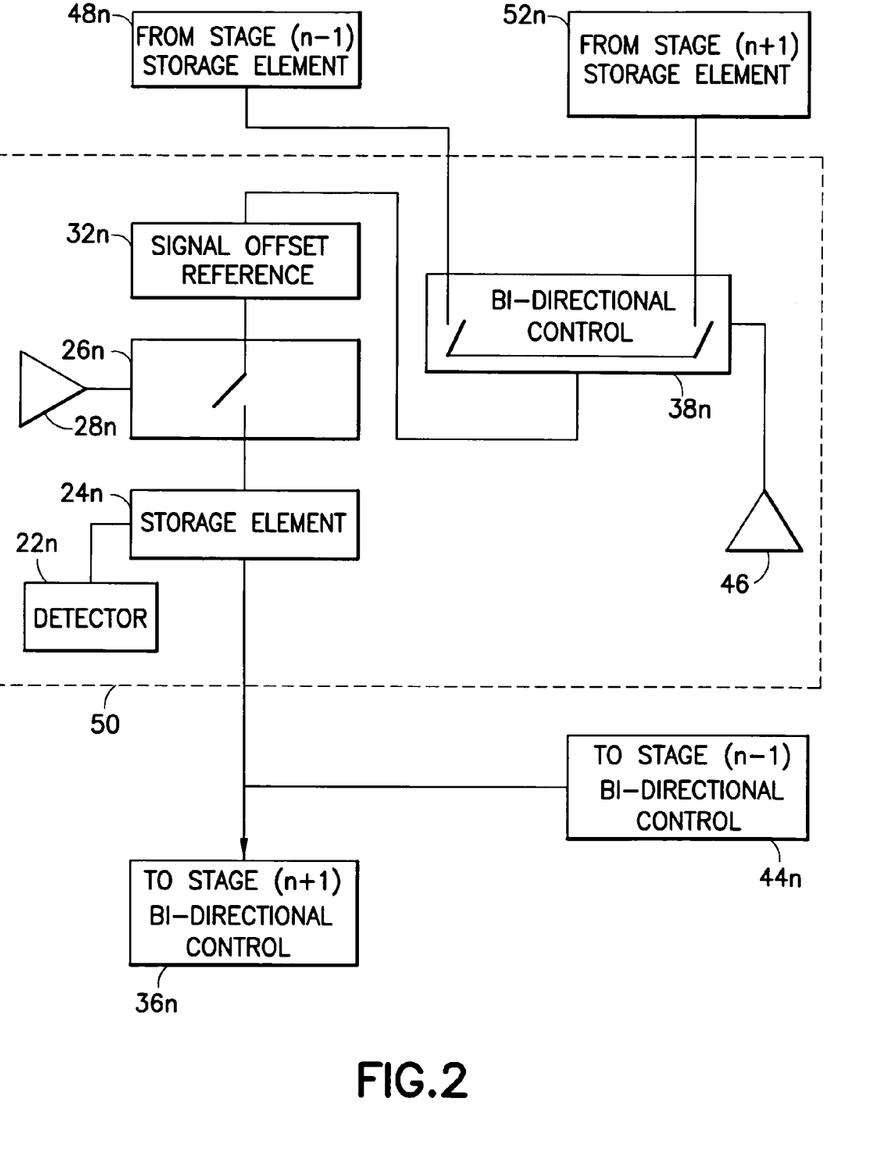
FIG. 2 is similar to FIG. 1 but for a TDI stage for use at an intermediate position 1<n<N of a pipelined time delay circuit between terminal TDI stages.

Components described with reference to FIG. 2 bearing a reference number with the suffix n are similar to those components of FIG. 1 bearing like reference numbers. FIG. 2 illustrates in block diagram an intermediate TDI stage 50 that is disposed between the first 20 and second terminal TDI stages. Assume FIG. 2 represents an intermediate TDI stage n, disposed between stages n−1 and n+1, where stage n−1 may be the first TDI stage or another stage similar to that of FIG. 2, and stage n+1 may be another stage similar to that of FIG. 2 or the second terminal stage. Operation of the storage element 24n receiving a photocurrent from the detector 22n based on the position of the reset switch 26n is as previously described. However, for an intermediate TDI stage 50 (and for the second terminal TDI stage), the signal offset reference voltage 32n is not the starvation level bias 30 as described with reference to FIG. 1, but rather (in the forward scan direction), the voltage from the previous stage's storage element that is output 48n to the bi-directional control switch 38n. In the forward scan direction, the bi-directional control switch 38 couples the output 48n from the storage element of the (n−1) stage to the reset switch 26n. When the directional control 46 reverses the direction of scan, the bi-directional control switch 38n flips to couple an output 52n from the storage element of the (n+1) TDI stage to the reset switch 26n.

Consider the forward scan direction for two TDI stages, a first stage as in FIG. 1 and a second stage as in FIG. 2. The storage element 24 of the first stage 20 integrates over a time frame the photocurrent from its detector 22 when the associated reset switch 26 is closed. The output 34, 52n from the first storage element 24 is the integrated voltage from its detector 22, which lies at the second signal reference offset block 32n through the bi-directional control switch 38n of the second stage 50 upon the next clock cycle when the reset switch 26 of the first stage 20 is reset. At the same time, the reset switch 26n of the second TDI stage 50 is closed, initializing (for that clock cycle) the storage element 24n of the second TDI stage 50 with the integrated voltage from the first TDI stage 20. When the reset switch 26n is again opened, a photocurrent from the detector 22n associated with the second stage 50 is integrated in that same storage element 24n. The photocurrents from each detector 22, 22n is therefore integrated at each stage 20, 50, and propagated through the entire pipeline as above, transiting each stage 20, 50 during one clock cycle. The integration is thus time-delayed throughout the entire pipelined circuit.

Figure 3:
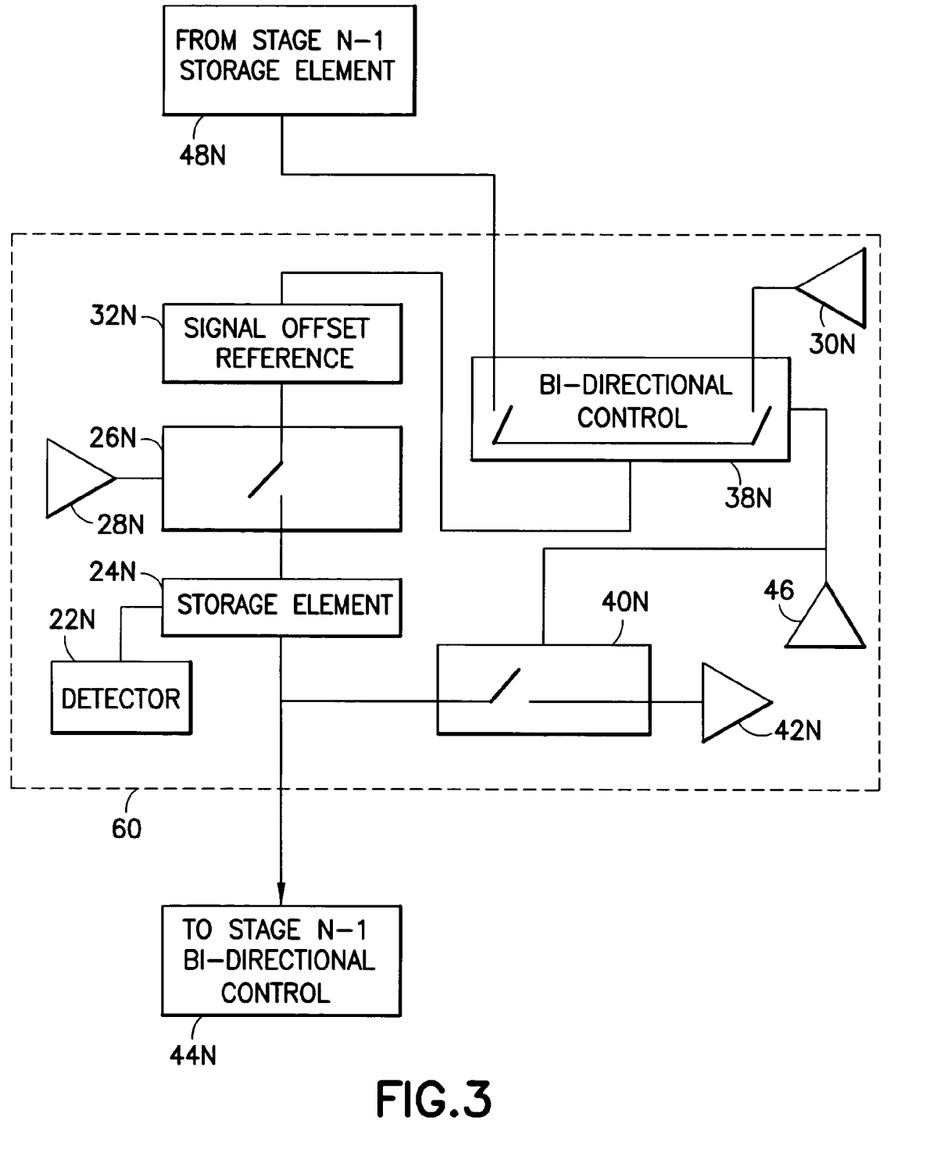
FIG. 3 is similar to FIG. 1 but for a TDI stage for use at a second terminal position n=N of a pipelined time delay circuit.

The second terminal stage 60, which is the last in the pipeline in the forward scan direction, is similar to the first terminal stage 20 when the stages are bi-directional. As above, the second terminal stage 60 is designated by the suffix N, in capital. An output from the previous (N−1) stage 48N is input to the signal offset reference block 32N through the bi-directional control switch 38N when in the forward scan direction. A switch controller 28N opens the reset switch 26N, holding the integrated charge that has propagated through the pipeline at the signal offset reference block 32N. The storage element 24N is initiated with that integrated and propagated charge once the reset switch is closed on the next clock cycle. Upon opening of the reset switch 26N, the storage element 24N accumulates charge from a photocurrent due to the $N^{th}$ detector 22N, yielding a total integrated charge for the entire pipelines stages (plus the initial starvation level bias voltage 30, 30N), designated $V_{final}$. In the forward scan direction, $V_{final}$ is output to signal processing 42N through the output enable switch 40N, which is closed in the second terminal stage 60 when in the forward scan direction.

In the reverse scan direction, the scan directional control 46 flips the bi-directional switch 38N, causing the storage element 24N to be initiated with the starvation level bias voltage 30. The directional controller also opens the output enable switch 40N. In the reverse scan direction, the second terminal stage 60 operates as was described for the first terminal stage 20 in the forward direction. Intermediate stages 50 operate similar to their description with reference to FIG. 2, except their bi-directional control switches enable the (n+1) stage to be coupled to the signal offset reference 32n instead of the (n−1) stage (where stage numbering is unchanged due to scan direction). The first terminal stage 20 then accumulates the total propagated charge $V_{final}$ when the pipeline is in the reverse scan direction, and its output enable switch 40 is closed so that $V_{final}$ is output 42 for processing of the integrated signal. For negative integrating systems, subtracting $V_{final}$ from the starvation level bias voltage 30, 30N results in a value that is the total integrated signal voltage. Similarly, for positive integrating systems, subtracting the starvation level bias voltage 30, 30N from $V_{final}$ results in the value that is the total integrated signal voltage.

Figure 4:
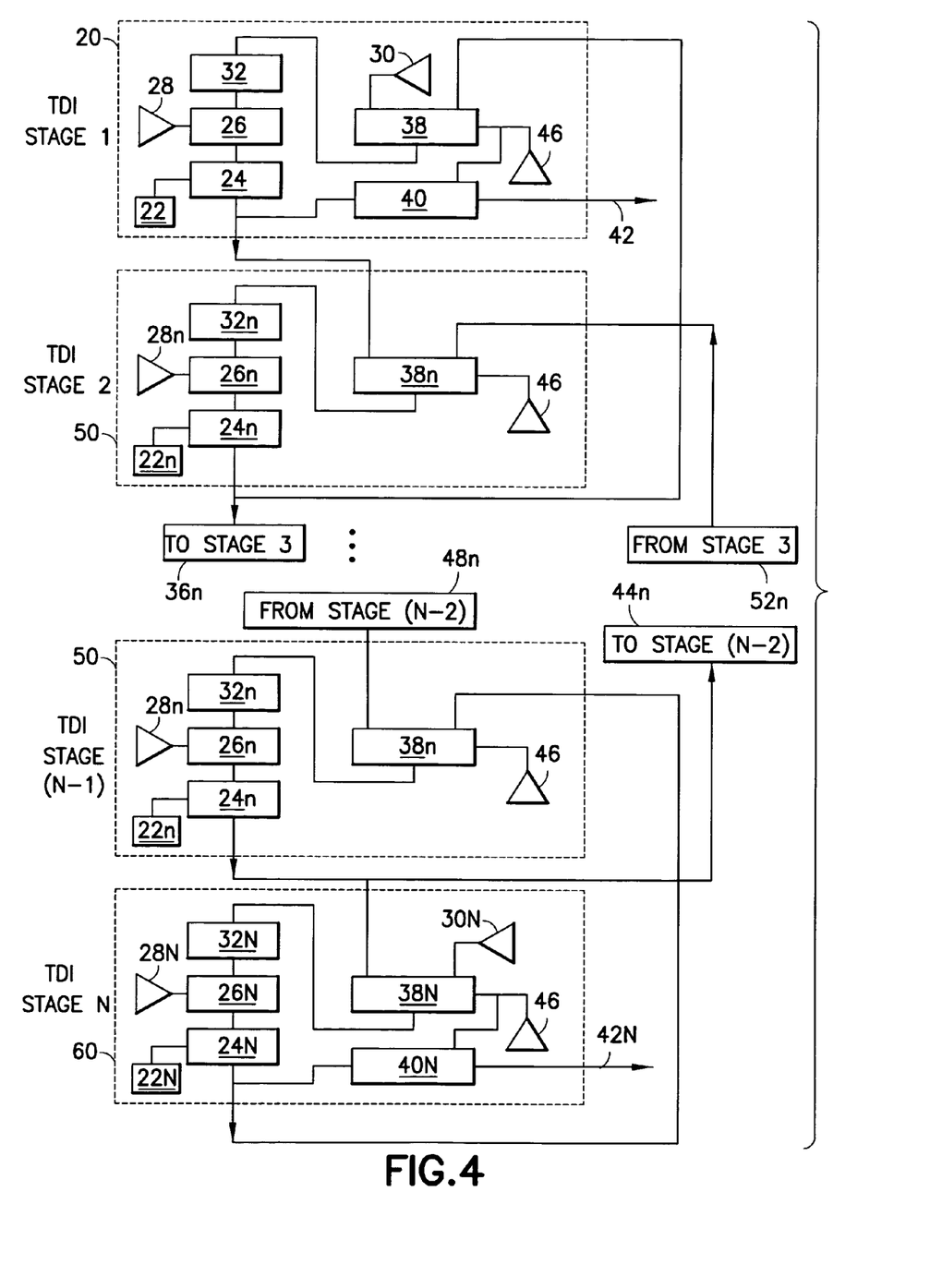
FIG. 4 is a block diagram of a series of TDI stages as in FIGS. 1-3 showing a pipelined time delay circuit according to the preferred embodiment.

FIG. 4 is a block diagram of TDI stages arranged in a pipeline format. Blocks within each stage are as previously described, wherein TDI stage 1 of FIG. 4 corresponds to the first terminal stage 20 as described with reference to FIG. 1; TDI stages 2 through (N−1) each correspond to the intermediate terminal stage 50 as described with reference to FIG. 2; and TDI stage N corresponds to the second terminal stage 60 as described with reference to FIG. 3. TDI stage 2 reflects stage n=2, and TDI stage (N−1) is immediately prior to the second terminal stage N so it represents stage n=(N−1). In the forward scan direction, a starvation level bias voltage is initiated at TDI stage 1, and voltage propagates from TDI stage 1 through the intermediate stages n=2 through n=(N−1), and finally through the second terminal stage N. The final voltage $V_{final}$ is output from TDI stage N. In the reverse scan direction, starvation level bias voltage is initiated at TDI stage N, voltage propagates from TDI stage N through the intermediate stages (n=(N−1) through n=2, in order) and finally through the first terminal stage n=1 where $V_{final}$ is output from TDI stage 1.

Figure 5:
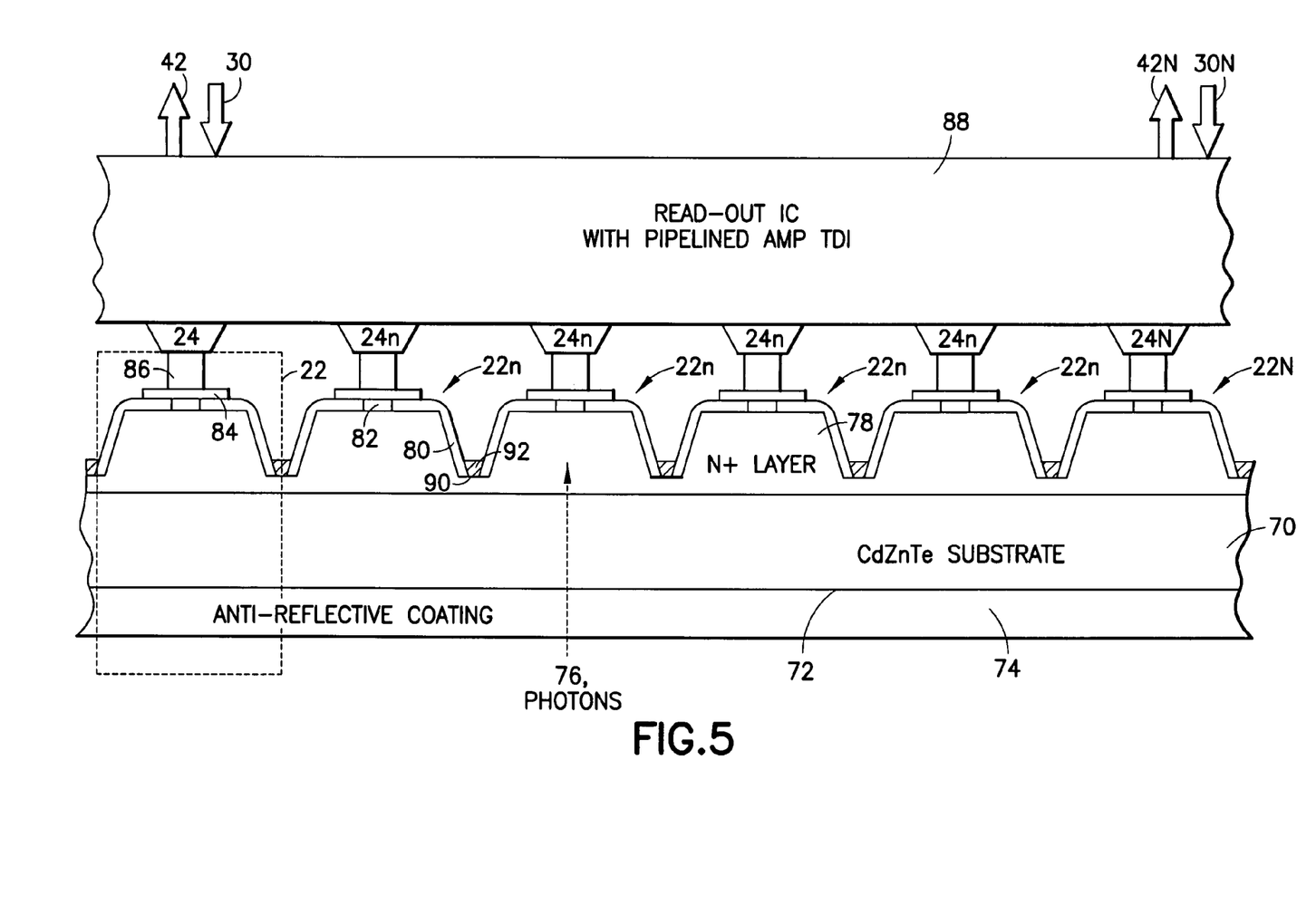
FIG. 5 is a plan view of an array of detectors disposed on a common substrate matched to a pipelined time delay circuit of the present invention disposed on a common read-out integrated circuitboard.

FIG. 5 is a plan view of an array of detectors 24, 24n, 24N disposed on a common substrate of, for example, CdZnTe that has disposed along a sensing surface 72 an anti-reflective coating to promote absorption of incident radiation such as photons 76. A detector layer 78 is formed into mesas as is known in the art to efficiently focus energy, each mesa delineating one detector element or pixel. About each pixel mesa is disposed an electrically conductive layer 80 defining a first pathway 82 through which photons may pass to a contact pad 84 and an indium bump 86 that is used to couple the detector array to read out circuitry such as the ROIC 88 which embodies the pipelined time delay circuit of the present invention. A second pathway 90 through the conductive layer 80 leads to a low resistance grounding point 92, typically a bit of metal disposed in the well defined by adjacent mesas. Each of the indium bumps 86 represent an output of a detector 22, 22n, 22N.

Married to the detector array is a ROIC 88 having a pipelined series of TDI stages 20, 50, 60. The indium bumps 86 couple to the storage elements 24, 24n, 24N or integrators of the circuit stages. Details of the individual circuit stages are depicted in FIGS. 1-4. Depending upon the scan direction, either the first terminal TDI stage 20 or the second terminal TDI stage 60 has an output that is coupled through the output enable switch 40, 40N to signal processing 42, 42N, which may or may not occur on the same chip or substrate 88 as the ROIC 88. Input into each of the first 20 and second 60 terminal stages is a starvation level bias 30, 30N, which is selectively input to the entire pipelined circuit only through one of the bi-directional control blocks 38, 38N. The starvation level bias voltage is also preferably routed to the signal processing or to the outputs 42, 42N of the TDI circuit so that it may be subtracted from the total integrated voltage as noted above.

The circuit architecture described herein may be readily implemented with currently available focal plane array preamplifier circuits. For example, a Source Follower per Detector (SFD) can be matched to the pipelined circuit described herein by allowing an output form each SFD stage to drive the reset voltage level of the subsequent detector input node. As another example, the pipeline circuit described herein may also be readily implemented with a Capacitive Transimpedence Amplifier (CTIA). For CTIAs with correlated double sampling (CDS), a bias is typically used to reset the starvation level bias voltage. The CTIA integrates photocurrent starting from this bias voltage. Further details concerning CTIAs and correlated double sampling may be found in co-owned U.S. Pat. Nos. 6,121,843 and 5,734,294, herein incorporated by reference. The present pipelined circuit architecture can use an output of each CTIA to drive a clamp reset level of the next TDI stage. Other FPA preamplifier circuits known in the art may also be readily enabled using the pipelined amplifier time delay integration described herein. In any event, the present invention may be disposed on an integrated circuit chip and coupled to another chip defining individual sensing elements or pixels. Where, as is common, each pixel defines an indium bump with which to mate with readout circuitry, the chip embodying the present invention would couple each indium bump to a storage element 24, 24n, 24N of a TDI stage 20, 50, 60. The pixels may be sensitive in the IR range (short, medium, or long wavelengths), or to other regions of the light spectrum.

The present invention also includes a method for integrating a signal from an arrayed series of n radiation detectors. In the method, an output signal from a first n=1 detector is integrated during a first time interval to achieve a first integrated signal. Preferably, that first integrator is biased with a starvation level voltage or other fixed potential prior to the first integration during the first interval. For each of the remaining n detectors, the method biases an $n^{th}$ integrator with the $(n-1)^{st}$ integrated signal, and integrates an output signal of the $n^{th}$ detector with the $n^{th}$ integrator over an $n^{th}$ time interval. This is done in sequence: the n=2 detector is integrated during the n=2 time interval, the n=3 detector is integrated during the n=3 time interval, etc. All time intervals are preferably equal to avoid complex signal processing later. When n=N and the signal from the last detector is integrated at the $N^{th}$ integrator, a total propagated voltage $V_{final}$ is output from a final $n=N^{th}$ integrator.

While the above describes one propagation through the pipelined integrators, it is to be noted that preferably, under steady state operation, each integrator operates during each integration interval so that the circuit provides an output from the final $N^{th}$ integrator during each interval.

What is claimed is:

1. A circuit comprising a first and a second stage,
the first stage comprising a first integrator having a first input for receiving a signal from a first detecting element, the first stage further comprising a first reset switch having an output coupled to a second input of the first integrator and an input coupled to a source of fixed bias voltage; and
the second stage comprising a second reset switch and a second integrator, wherein the second reset switch has an input coupled to an output of the first integrator, and the second integrator has a first input for receiving a signal from a second detecting element and a second input coupled to an output of the second reset switch, wherein the second reset switch resets the second integrator to a voltage resulting from integration at the first integrator, wherein the first stage further comprises a first bi-directional control switch disposed between the source of fixed bias voltage and the first reset switch for coupling the first reset switch alternatively to the source of fixed bias voltage and an output of the second integrator.

2. The circuit of claim 1 wherein the second reset switch is coupled to a controller that causes the second reset switch to de-couple the first and second stages during a first time interval and a second time interval and to couple the first and second stages during a time period between the first and second time intervals.

3. The circuit of claim 1 wherein the second stage further comprises a second bi-directional control switch disposed between the second reset switch and the output of the first integrator, said second bi-directional control switch coupling the second reset switch alternatively to the output of the first integrator and an output of a third integrator of a third stage.

4. The circuit of claim 1 wherein the second stage further comprises a second bi-directional control switch disposed between the second reset switch and the output of the first integrator, said second bi-directional control switch coupling the second reset switch alternatively to the output of the first integrator and to a second source of fixed bias voltage.

5. The circuit of claim 4 wherein said second stage further comprises an output enable switch that is closed when said second bi-directional control switch couples the input of the second reset switch to the output of the first integrator.

6. The circuit of claim 1 wherein said first stage further comprises an output enable switch that is closed when said first bi-directional control switch couples the first reset switch to the output of the second integrator.

7. A circuit comprising:
 first means for integrating a first signal from a first sensor over a first time interval;
 a first reset switch to selectively couple the first integrating means to a fixed potential when closed;
 second means for integrating a second signal from a second sensor over a second time interval subsequent to the first time interval;
 a second reset switch disposed between the first means for integrating and the second means for integrating, wherein the second reset switch resets the second means for integrating to a voltage resulting from integration by the first means for integrating; and
 a bi-directional control switch disposed between the fixed potential and the first reset switch for coupling the first reset switch alternatively to the fixed potential and an output of the second means for integrating.

8. The circuit of claim 7 wherein at least one of the first and second means for integrating comprises at least one of: a resistor coupled to a capacitor, an op-amp, and a transistor.

9. The circuit of claim 7 wherein said second reset switch is open and closed with said first reset switch.

10. The circuit of claim 7 further comprising an output enable switch coupled to the output of the second means for integrating.

11. The circuit of claim 10 wherein said output enable switch is open and closed with said second reset switch.

12. A system comprising:
 a detector array comprising a plurality of detecting elements disposed on a common substrate, each detector element having an electrical output;
 a circuit board comprising two terminal circuit stages and at least one intermediate circuit stages therebetween disposed on a common substrate, each circuit stage disposed in electrical series with one another,
 each circuit stage comprising an integrator having a first input coupled to an output of a respective detector element and a second input coupled to a respective reset switch, each reset switch coupled to a common timing means for operating each of said reset switches in unison,
 wherein for each intermediate circuit stage and at least one of the terminal circuit stages, the reset switch further comprises an input coupled to an output of an integrator of a previous circuit stage, wherein each reset switch resets the respective integrator of the circuit stage to a voltage resulting from integration at the previous circuit stage,
 wherein each intermediate circuit stage further comprises a bi-directional switch having an output coupled to an input of the reset switch to selectively couple said reset switch to an output of an integrator of one or another circuit stages, and
 wherein at least the other of the terminal circuit stages further comprises an output from the series of circuit stages.

13. The system of claim 12 wherein each terminal stage further comprises an output from the series of circuit stages and an output enable switch disposed between the integrator and the output from the series, each of said output enable switches operable only in opposition to one another.

14. The system of claim 13 wherein each terminal stage further comprises:
 a bi-directional switch having an output coupled to an input of the reset switch to selectively couple said reset switch to an output of an integrator of another circuit stage and to a source of bias voltage.

* * * * *